US007678533B2

(12) United States Patent
Van Aert et al.

(10) Patent No.: US 7,678,533 B2
(45) Date of Patent: Mar. 16, 2010

(54) HEAT-SENSITIVE LITHOGRAPHIC PRINTING PLATE PRECURSOR

(75) Inventors: Hubertus Van Aert, Pulderbos (BE); Stefaan Lingier, Assenede (BE)

(73) Assignee: Agfa Graphics, N.V., Mortsel (BE)

( * ) Notice: Subject to any disclaimer, the term of this patent is extended or adjusted under 35 U.S.C. 154(b) by 159 days.

(21) Appl. No.: 11/478,252

(22) Filed: Jun. 29, 2006

(65) Prior Publication Data

US 2007/0003870 A1 Jan. 4, 2007

Related U.S. Application Data

(60) Provisional application No. 60/700,189, filed on Jul. 18, 2005.

(30) Foreign Application Priority Data

Jun. 30, 2005 (EP) ................................ 05105881

(51) Int. Cl.
*G03F 7/09* (2006.01)
*G03F 7/11* (2006.01)

(52) U.S. Cl. ................................ 430/271.1; 430/270.1

(58) Field of Classification Search ............. 430/270.1, 430/271.1, 302, 435
See application file for complete search history.

(56) References Cited

U.S. PATENT DOCUMENTS

| | | | |
|---|---|---|---|
| 3,912,844 A | 10/1975 | Endo et al. | |
| 3,929,488 A | 12/1975 | Smith | |
| 3,971,660 A | 7/1976 | Staehle | |
| 4,045,232 A | 8/1977 | Parkinson | |
| 4,115,128 A | 9/1978 | Kita | |
| 4,284,705 A | 8/1981 | Phlipot et al. | |
| 4,458,005 A | 7/1984 | Mohr et al. | |
| 4,840,713 A | 6/1989 | Pliefke | |
| 4,897,168 A | 1/1990 | Boergerding et al. | |
| 4,981,517 A | 1/1991 | DeSanto, Jr. et al. | |
| 5,147,205 A | 9/1992 | Gross et al. | |
| 5,156,723 A | 10/1992 | Pliefke et al. | |
| 5,163,368 A | 11/1992 | Pensavecchia et al. | |
| 5,174,205 A | 12/1992 | Klien et al. | |
| 5,229,253 A | 7/1993 | Zertani et al. | |
| 5,314,787 A | 5/1994 | Elsaesser et al. | |
| 5,556,531 A | 9/1996 | Wiedemann | |
| 5,637,441 A | 6/1997 | Brenk et al. | |
| 5,641,608 A | 6/1997 | Grunwald et al. | |
| 5,695,903 A | 12/1997 | Elsaesser et al. | |
| 5,700,621 A | 12/1997 | Eichhorn et al. | |
| 6,140,392 A | 10/2000 | Kingman et al. | |
| 6,143,464 A | 11/2000 | Kawauchi | |
| 6,190,825 B1 * | 2/2001 | Denzinger et al. | 430/192 |
| 2003/0143481 A1 * | 7/2003 | Iwato et al. | 430/270.1 |
| 2004/0152018 A1 * | 8/2004 | Arias et al. | 430/273.1 |

FOREIGN PATENT DOCUMENTS

| | | |
|---|---|---|
| DE | 40 01 466 A1 | 7/1991 |
| DE | 40 07 428 A1 | 9/1991 |
| DE | 40 27 301 A1 | 3/1992 |
| DE | 44 17 907 A1 | 11/1995 |
| DE | 44 23 140 A1 | 1/1996 |
| DE | 44 45 820 A1 | 6/1996 |
| EP | 0 291 760 A2 | 11/1988 |
| EP | 0 292 801 A2 | 11/1988 |
| EP | 0 537 633 A1 | 4/1993 |
| EP | 0 601 240 A1 | 6/1994 |
| EP | 0 619 524 A1 | 10/1994 |
| EP | 0 619 525 A1 | 10/1994 |
| EP | 0 620 502 A1 | 10/1994 |
| EP | 0 659 909 A1 | 6/1995 |
| EP | 0 731 113 A2 | 9/1996 |
| EP | 0 823 327 A2 | 2/1998 |
| EP | 0 825 927 A1 | 3/1998 |
| EP | 0 864 420 A1 | 9/1998 |
| EP | 0 894 622 A2 | 2/1999 |
| EP | 0 901 902 A2 | 3/1999 |

(Continued)

OTHER PUBLICATIONS

European Search Report in EP 05 10 5881 (Nov. 11, 2005).

(Continued)

*Primary Examiner*—Cynthia H Kelly
*Assistant Examiner*—Anca Eoff
(74) *Attorney, Agent, or Firm*—Leydig, Voit & Mayer, Ltd.

(57) ABSTRACT

A heat-sensitive lithographic printing plate precursor is disclosed which comprises a support having a hydrophilic surface and a coating which does not dissolve in an aqueous alkaline developer in the unexposed areas and which becomes soluble in an aqueous alkaline developer in the exposed areas, and an intermediate layer between said hydrophilic surface or said hydrophilic layer and said coating, wherein the intermediate layer comprises a first polymer having a first monomeric unit of formula I (formula I)

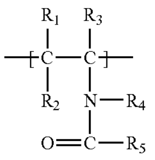

wherein $R_1$, $R_2$ and $R_3$ are independently a hydrogen atom or an optionally substituted alkyl group, $R_4$ and $R_5$ are independently an optionally substituted alkyl, cycloalkyl, aryl or arylalkyl group.

The precursor exhibits an excellent differentiation in dissolution kinetics between the exposed and non-exposed areas of the coating and a high chemical resistance against printing liquids and press chemicals.

5 Claims, 5 Drawing Sheets

FOREIGN PATENT DOCUMENTS

| | | | |
|---|---|---|---|
| EP | 0 909 657 | A2 | 4/1999 |
| EP | 0 933 682 | A2 | 8/1999 |
| EP | 0 934 822 | A1 | 8/1999 |
| EP | 0 950 517 | A1 | 10/1999 |
| EP | 0 982 123 | A2 | 3/2000 |
| EP | 1 072 432 | A2 | 1/2001 |
| EP | 1 120 246 | A2 | 8/2001 |
| EP | 1 211 065 | A2 | 6/2002 |
| EP | 1 241 003 | A2 | 9/2002 |
| EP | 1 262 318 | A2 | 12/2002 |
| EP | 1 263 590 | A2 | 12/2002 |
| EP | 1 268 660 | A2 | 1/2003 |
| EP | 1 275 498 | A2 | 1/2003 |
| EP | 1 291 172 | A2 | 3/2003 |
| EP | 1 299 238 | A1 | 4/2003 |
| EP | 1 303 399 | A1 | 4/2003 |
| EP | 1 311 394 | A1 | 5/2003 |
| EP | 1 368 413 | A1 | 12/2003 |
| EP | 1 433 594 | A2 | 6/2004 |
| EP | 1 439 058 | A2 | 7/2004 |
| EP | 1 506 858 | A2 | 2/2005 |
| EP | 1 011 970 | A2 | 6/2006 |
| FR | 2 300 354 | | 9/1976 |
| GB | 1 084 070 | | 9/1967 |
| GB | 1 419 512 | | 12/1975 |
| JP | 20 96755 | A1 | 4/1990 |
| JP | 60 88942 | | 3/1994 |
| JP | 2004-117534 | * | 4/2004 |
| WO | WO 97/39894 | A1 | 10/1997 |
| WO | WO 99/01795 | A2 | 1/1999 |
| WO | WO 99/21725 | A1 | 5/1999 |
| WO | WO 99/63407 | A1 | 12/1999 |
| WO | WO 99/67097 | A2 | 12/1999 |
| WO | WO 00/32705 | A1 | 6/2000 |
| WO | WO 01/09682 | A2 | 2/2001 |
| WO | WO 01/45958 | A2 | 6/2001 |
| WO | WO 01/46318 | A1 | 6/2001 |
| WO | WO 01/96119 | A1 | 12/2001 |
| WO | WO 02/14071 | A1 | 2/2002 |
| WO | WO 02/053626 | A1 | 7/2002 |
| WO | WO 02/053627 | A1 | 7/2002 |
| WO | WO 02/096649 | A1 | 12/2002 |
| WO | WO 2004/020484 | A1 | 3/2004 |
| WO | WO 03/074287 | A1 | 4/2004 |
| WO | WO 2004/033206 | A1 | 4/2004 |
| WO | WO 2004/035310 | A1 | 4/2004 |
| WO | WO 2004/035645 | A1 | 4/2004 |
| WO | WO 2004/035686 | A2 | 4/2004 |
| WO | WO 2004/035687 | A1 | 4/2004 |

OTHER PUBLICATIONS

Stober; *J. Colloid and Interface, Science*; vol. 26; pp. 62-69; 1968.

* cited by examiner

HEAT-SENSITIVE LITHOGRAPHIC PRINTING PLATE PRECURSOR

CROSS-REFERENCE TO RELATED PATENT APPLICATIONS

This application claims the benefit of U.S. Provisional Application No. 60/700,189 filed Jul. 18, 2005, which is incorporated by reference. In addition, this application claims the benefit of European Application No. 05105881.6 filed Jun. 30, 2005, which is also incorporated by reference.

DESCRIPTION

1. Field of the Invention

The present invention relates to a heat-sensitive lithographic printing plate precursor.

2. Background of the Invention

Lithographic printing typically involves the use of a so-called printing master such as a printing plate which is mounted on a cylinder of a rotary printing press. The master carries a lithographic image on its surface and a print is obtained by applying ink to said image and then transferring the ink from the master onto a receiver material, which is typically paper. In conventional lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-adhesive (ink-repelling) areas and during driographic printing, only ink is supplied to the master.

Printing masters are generally obtained by the image-wise exposure and processing of an imaging material called plate precursor. A typical positive-working plate precursor comprises a hydrophilic support and an oleophilic coating which is not readily soluble in an aqueous alkaline developer in the non-exposed state and becomes soluble in the developer after exposure to radiation. In addition to the well known photosensitive imaging materials which are suitable for UV contact exposure through a film mask (the so-called pre-sensitized plates), also heat-sensitive printing plate precursors have become very popular. Such thermal materials offer the advantage of daylight stability and are especially used in the so-called computer-to-plate method (CtP) wherein the plate precursor is directly exposed, i.e. without the use of a film mask. The material is exposed to heat or to infrared light and the generated heat triggers a (physico-)chemical process, such as ablation, polymerization, insolubilization by cross-linking of a polymer or by particle coagulation of a thermoplastic polymer latex, and solubilization by the destruction of intermolecular interactions or by increasing the penetrability of a development barrier layer.

Although some of these thermal processes enable plate making without wet processing, the most popular thermal plates form an image by a heat-induced solubility difference in an alkaline developer between exposed and non-exposed areas of the coating. The coating typically comprises an oleophilic binder, e.g. a phenolic resin, of which the rate of dissolution in the developer is either reduced (negative working) or increased (positive working) by the image-wise exposure. During processing, the solubility differential leads to the removal of the non-image (non-printing) areas of the coating, thereby revealing the hydrophilic support, while the image (printing) areas of the coating remain on the support.

Typically, for a positive-working thermal plate, a dissolution inhibitor is added to a phenolic resin as binder whereby the rate of dissolution of the coating is reduced. Upon heating, this reduced rate of dissolution of the coating is increased on the exposed areas compared with the non-exposed areas, resulting in a sufficient difference in solubility of the coating after image-wise recording by heat or IR-radiation. Many different dissolution inhibitors are known and disclosed in the literature, such as organic compounds having an aromatic group and a hydrogen bonding site or polymers or surfactants comprising siloxane or fluoroalkyl units.

The known heat-sensitive printing plate precursors typically comprise a hydrophilic support and a coating which is alkali-soluble in exposed areas (positive working material) or in non-exposed areas (negative working material) and an IR-absorbing compound. Such coating typically comprises an oleophilic polymer which may be a phenolic resin such as novolac, resol or a polyvinylphenolic resin. The phenolic resin can be chemically modified whereby the phenolic monomeric unit is substituted by a group such as described in WO99/01795, EP 934 822, EP 1 072 432, U.S. Pat. No. 3,929,488, WO2004/35687, WO2004/35686, WO2004/35645, WO2004/35310. The phenolic resin can also been mixed with another polymer such as an acidic polyvinyl acetal as described in WO2004/020484 or a copolymer comprising sulfonamide groups as described in U.S. Pat. No. 6,143,464. The use of other polymeric binders in lithographic printing plates are described in WO2001/09682, EP 933 682, WO99/63407, WO2002/53626, EP 1 433 594 and EP 1 439 058.

The positive-working thermal plate may further comprise, between the heat-sensitive recording layer and the support, an intermediate layer comprising an alkali soluble resin. This layer induces an improved removing of the coating on the exposed areas. Typical examples of positive-working thermal plate materials having such a two layer structure are described in e.g. EP 864420, EP 909657, EP-A 1011970, EP-A 1263590, EP-A 1268660, EP-A 1072432, EP-A 1120246, EP-A 1303399, EP-A 1311394, EP-A 1211065, EP-A 1368413, EP-A 1241003, EP-A 1299238, EP-A 1262318, EP-A 1275498, EP-A 1291172, WO2003/74287, WO2004/33206, EP-A 1433594 and EP-A 1439058.

EP 731 113 discloses a light sensitive material for a lithographic printing plate. The material comprises 1,2-quinonediazide and a polymeric binder such as a copolymer comprising N-methacryloylaminomethyl-phthalimide as monomeric unit.

SUMMARY OF THE INVENTION

The printing plate precursor of the present invention is positive-working, i.e. after exposure and development the exposed areas of the oleophilic coating, hereinafter also referred to as "heat-sensitive coating" or "coating", and of the intermediate layer are removed from the support and define hydrophilic, non-image (non-printing) areas, whereas the unexposed areas of the coating and of the intermediate layer are not removed from the support and define oleophilic image (printing) areas. The polymers of the prior art are not suited for use in the intermediate layer because an insufficient differentiation in dissolution kinetics between the exposed and non-exposed areas upon heating was obtained. Therefore, the inventors found a new polymeric binder for the intermediate layer. The precursor comprising an intermediate layer with this polymer as binder is able to exhibit an excellent differentiation in dissolution kinetics between the exposed and non-exposed areas of the coating and which has also the advantage of a high chemical resistance of the coating, i.e. the resistance of the coating against printing liquids such as ink, e.g. UV-inks, fountain solution, plate and blanker cleaners.

It is an aspect of the present invention to provide a heat-sensitive lithographic printing plate precursor as defined in claim 1, having the characteristic feature the polymer in the intermediate layer of the precursor comprises a first monomeric unit of formula I (formula I)

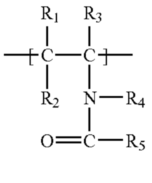

wherein $R_1$, $R_2$ and $R_3$ are independently a hydrogen atom or an optionally substituted alkyl group, $R_4$ and $R_5$ are independently an optionally substituted alkyl, cycloalkyl, aryl or arylalkyl group, or wherein $R_4$ and $R_5$ together form a cyclic structure.

Specific embodiments of the invention are defined in the dependent claims.

DETAILED DESCRIPTION OF THE INVENTION

Figure 1:
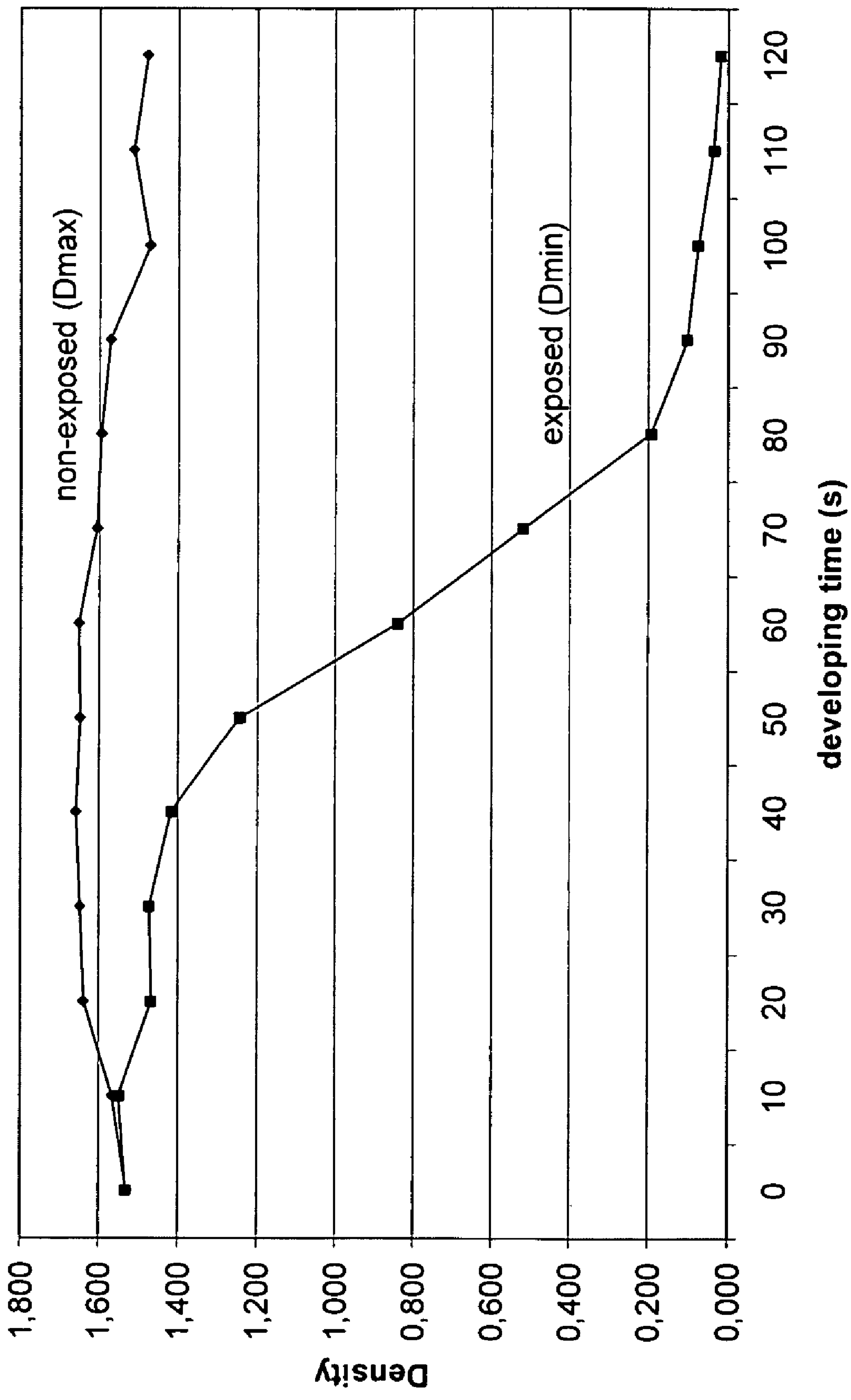
FIG. 1 shows the dissolution kinetics between the exposed and non-exposed areas of the coating for PPP-01, i.e. the optical density of irradiated (Dmin) and non-irradiated (Dmax) parts versus developing time (in seconds).
Figure 2:
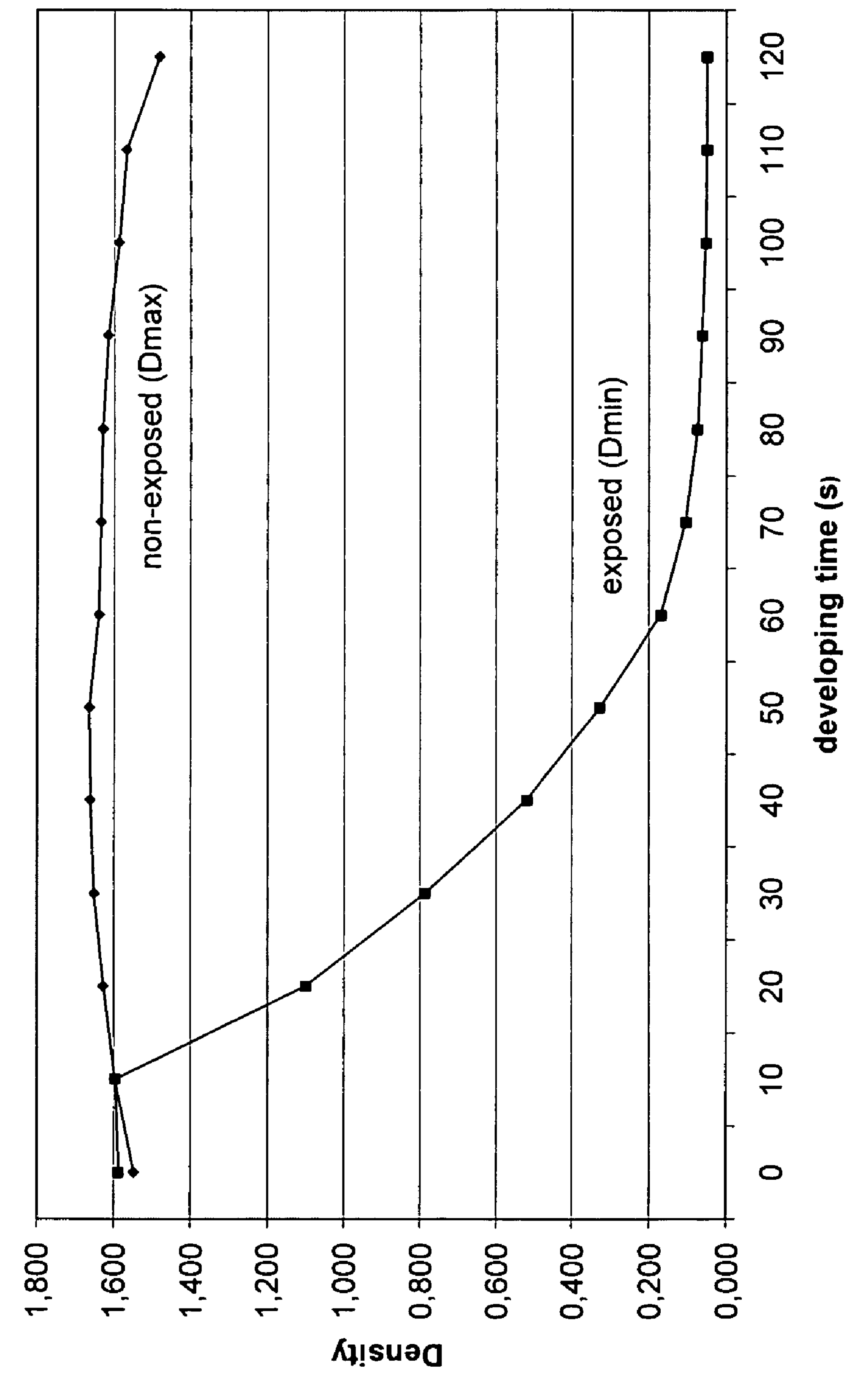
FIG. 2 shows the dissolution kinetics between the exposed and non-exposed areas of the coating for PPP-02, i.e. the optical density of irradiated (Dmin) and non-irradiated (Dmax) parts versus developing time (in seconds).
Figure 3:
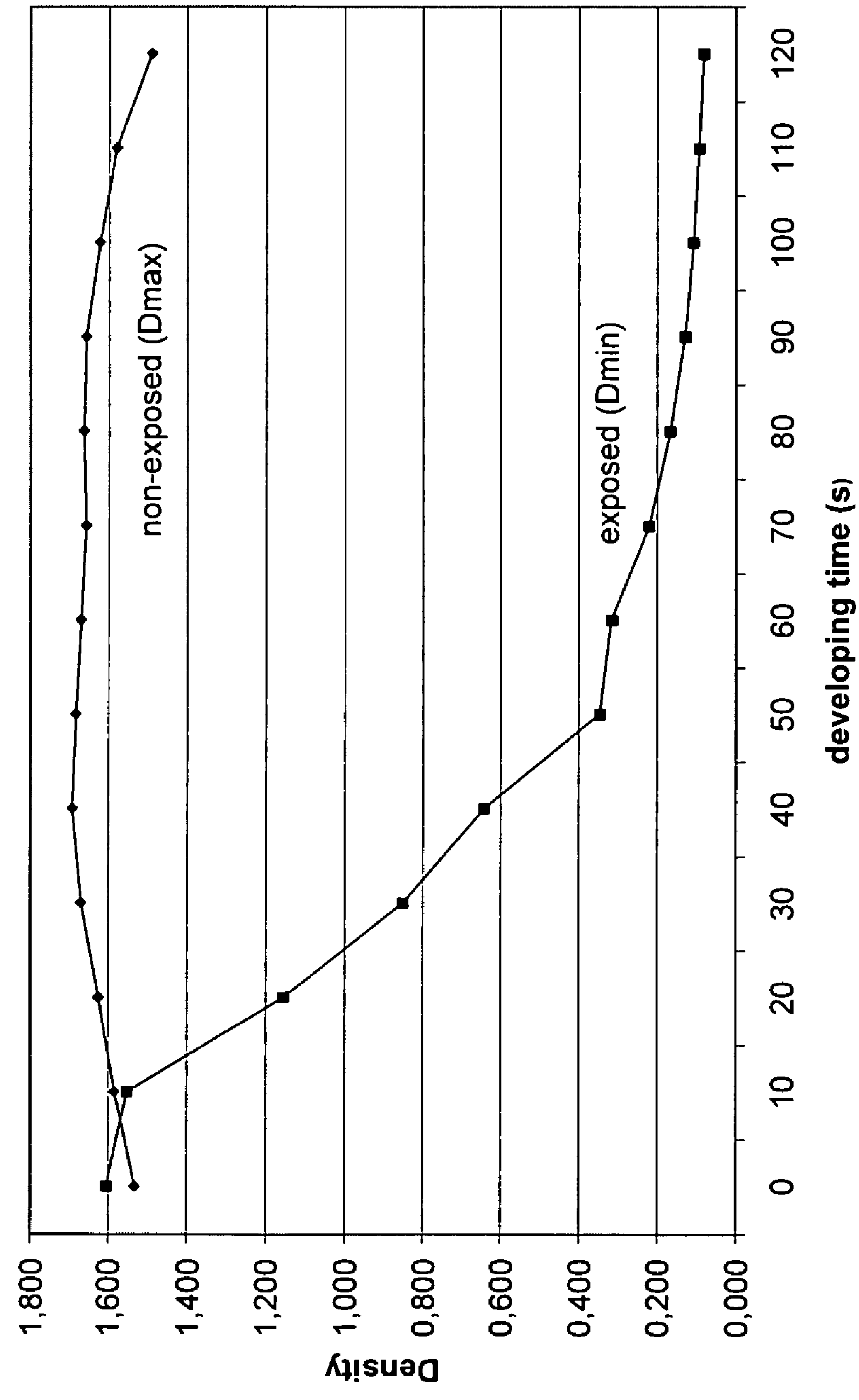
FIG. 3 shows the dissolution kinetics between the exposed and non-exposed areas of the coating for PPP-03, i.e. the optical density of irradiated (Dmin) and non-irradiated (Dmax) parts versus developing time (in seconds).
Figure 4:
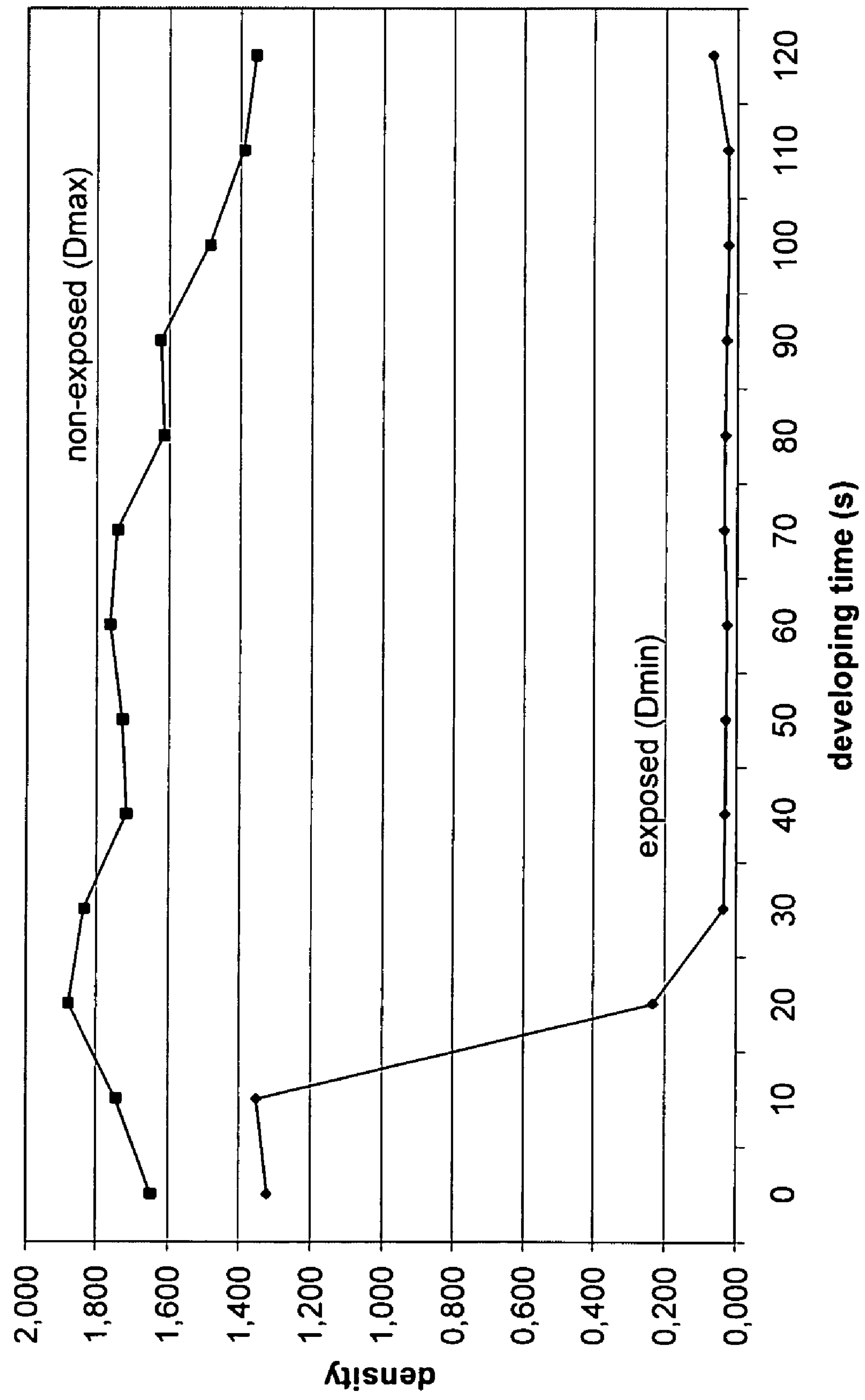
FIG. 4 shows the dissolution kinetics between the exposed and non-exposed areas of the coating for PPP-04, i.e. the optical density of irradiated (Dmin) and non-irradiated (Dmax) parts versus developing time (in seconds).

In accordance with the present invention, there is provided a heat-sensitive lithographic printing plate precursor comprising a support having a hydrophilic surface or which is provided with a hydrophilic layer, a coating which does not dissolve in an aqueous alkaline developer in the unexposed areas and which becomes soluble in an aqueous alkaline developer in the exposed areas, and an intermediate layer between the hydrophilic surface or hydrophilic layer and the coating, characterised in that said intermediate layer comprises a first polymer having a first monomeric unit of formula I (formula I)

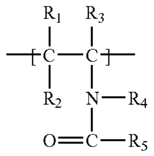

wherein $R_1$, $R_2$ and $R_3$ are independently a hydrogen atom or an optionally substituted alkyl group, $R_4$ and $R_5$ are independently an optionally substituted alkyl, cycloalkyl, aryl or arylalkyl group, or wherein $R_4$ and $R_5$ together form a cyclic structure.

In a preferred embodiment, the cyclic structure, formed by the $R_4$ and $R_5$ together, comprises at least 5 carbon atoms. In a still more preferred embodiment, the first monomeric unit is vinylcaprolactam. The first polymer preferably comprises the first monomeric unit in an amount ranging between 3 and 75 mol %, more preferably between 4 and 50 mol %, most preferably between 5 and 40 mol %.

In another embodiment of the present invention, the first polymer further comprises a second monomeric unit of formula II (formula II)

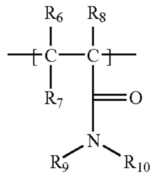

wherein $R_6$, $R_7$ and $R_8$ are independently a hydrogen atom or an optionally substituted alkyl group, $R_9$ is a hydrogen atom, or an optionally substituted alkyl, cycloalkyl, aryl or arylalkyl group, $R_{10}$ is represented by formula III or IV:

(formula III)

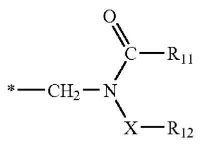

(formula IV)

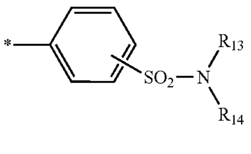

wherein

* denotes the position of attachment of the group $R_{10}$ to the nitrogen atom in the above formula II, X is —C(=O)— or —$SO_2$—, $R_{11}$ and $R_{12}$ are independently an optionally substituted alkyl, alkenyl, cycloalkyl, aryl, arylalkyl or heteroaryl group, or wherein $R_{11}$ and $R_{12}$ together form a cyclic structure, $R_{13}$ and $R_{14}$ are independently a hydrogen atom, or an optionally substituted alkyl, alkenyl, cycloalkyl, aryl, arylalkyl or heteroaryl group, or wherein $R_{13}$ and $R_{14}$ together form a cyclic structure.

In a preferred embodiment, $R_{10}$ has the structure of formula V:

(formula V)

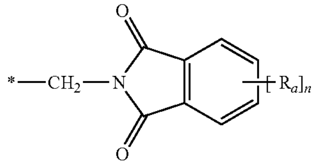

wherein

* denotes the position of attachment of the group $R_{10}$ to the nitrogen atom in the above formula II, n is 0, 1, 2, 3 or 4, each $R_a$ is independently selected from hydrogen, halogen, —CN, —$NO_2$, an optionally substituted alkyl, alkenyl, alkynyl, cycloalkyl, heterocyclic, aryl, heteroaryl, aralkyl or heteroaralkyl group, —O—$R_b$, —S—$R_c$, —$SO_3$—$R_d$, —CO—O—$R_e$, —O—CO—$R_f$, —$NR_gR_h$, —$NR_i$—CO—$R_j$, —$NR_k$—$SO_2$—$R_l$, —CO—$R_m$, —CO—$NR_nR_o$, —$SO_2$—$NR_pR_q$ or —P(=O)(—O—$R_r$)(—O—$R_s$), wherein $R_b$ to $R_s$ are independently selected from hydrogen or an optionally substituted alkyl or aryl group.

The second monomeric unit is preferably N-acryloylaminomethyl-phthalimide or N-methacryloylaminomethyl-phthalimide.

The first polymer preferably comprises the second monomeric unit in an amount ranging between 5 and 95 mol %, more preferably between 10 and 85 mol %, most preferably between 20 and 75 mol %.

In another embodiment of the present invention, the first polymer further comprises a third monomeric unit of formula VI:

(formula VI)

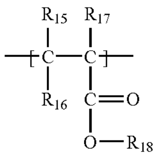

wherein $R_{15}$, $R_{16}$ and $R_{17}$ are independently a hydrogen atom or an optionally substituted alkyl group, $R_{18}$ is a hydrogen atom, a positive charged metal ion or ammonium ion, or an optionally substituted alkyl, cycloalkyl, aryl or arylalkyl group.

In a preferred embodiment, the third monomeric unit is (meth)acrylic acid or salts or alkyl esters thereof.

The first polymer preferably comprises the third monomeric unit in an amount ranging between 2 and 70 mol %, more preferably between 5 and 60 mol %, most preferably between 10 and 50 mol %.

In another preferred embodiment of the present invention, the first polymer comprises a combination of a first monomeric unit of formula I, a second monomeric unit of formula II and a third monomeric unit of formula VI. The first polymer preferably comprises these three monomeric units in an amount ranging between 5 and 35 mol % for the first monomeric unit, between 20 and 75 mol % for the second monomeric unit and between 3 and 35 mol % for the third monomeric unit. In a more preferred embodiment of the present invention, the first polymer comprises a combination of N-vinylcaprolactam, N-(meth)acryloylaminomethyl-phthalimide and (meth)acrylic acid. The first polymer preferably comprises N-vinylcaprolactam in the in an amount ranging between 5 and 35 mol %, more preferably between 10 and 30 mol %, N-(meth)acryloylamino methyl-phthalimide between 20 and 75 mol %, more preferably between 30 and 65 mol %, (meth)acrylic acid between 3 and 35 mol %, more preferably between 10 and 30 mol %.

The heat-sensitive coating does not dissolve in an aqueous alkaline developer in the unexposed areas and becomes soluble in an aqueous alkaline developer in the exposed areas. The coating comprises a second polymer which is preferably a phenolic resin, more preferably novolac, resoles, a polyvinyl phenol or a carboxy-substituted polymer, novolac is most preferred. Typical examples of such polymers are described in DE-A-4007428, DE-A-4027301 and DE-A-4445820. Other preferred second polymers are phenolic resins wherein the phenyl group or the hydroxy group of the phenolic monomeric unit are chemically modified with an organic substituent as described in EP 894 622, EP 901 902, EP 933 682, WO99/63407, EP 934 822, EP 1 072 432, U.S. Pat. No. 5,641,608, EP 982 123, WO99/01795, WO04/035310, WO04/035686, WO04/035645, WO04/035687 or EP 1 506 858.

The novolac resin or resol resin may be prepared by polycondensation of at least one member selected from aromatic hydrocarbons such as phenol, o-cresol, p-cresol, m-cresol, 2,5-xylenol, 3,5-xylenol, resorcinol, pyrogallol, bisphenol, bisphenol A, trisphenol, o-ethylphenol, p-etylphenol, propylphenol, n-butylphenol, t-butylphenol, 1-naphtol and 2-naphtol, with at least one aldehyde or ketone selected from aldehydes such as formaldehyde, glyoxal, acetoaldehyde, propionaldehyde, benzaldehyde and furfural and ketones such as acetone, methyl ethyl ketone and methyl isobutyl ketone, in the presence of an acid catalyst. Instead of formaldehyde and acetaldehyde, paraformaldehyde and paraldehyde may, respectively, be used.

The weight average molecular weight, measured by gel permeation chromatography using universal calibration and polystyrene standards, of the novolac resin is preferably from 500 to 150,000 g/mol, more preferably from 1,500 to 15,000 g/mol.

The poly(vinylphenol) resin may also be a polymer of one or more hydroxy-phenyl containing monomers such as hydroxystyrenes or hydroxy-phenyl(meth)acrylates. Examples of such hydroxystyrenes are o-hydroxystyrene, m-hydroxystyrene, p-hydroxystyrene, 2-(o-hydroxyphenyl)

propylene, 2-(m-hydroxyphenyl)propylene and 2-(p-hydroxyphenyl)propylene. Such a hydroxystyrene may have a substituent such as chlorine, bromine, iodine, fluorine or a $C_{1-4}$ alkyl group, on its aromatic ring. An example of such hydroxy-phenyl (meth)acrylate is 2-hydroxy-phenyl methacrylate.

The poly(vinylphenol) resin may usually be prepared by polymerizing one or more hydroxy-phenyl containing monomer in the presence of a radical initiator or a cationic polymerization initiator. The poly(vinylphenol) resin may also be prepared by copolymerizing one or more of these hydroxy-phenyl containing monomers with other monomeric compounds such as acrylate monomers, methacrylate monomers, acrylamide monomers, methacrylamide monomers, vinyl monomers, aromatic vinyl monomers or diene monomers.

The weight average molecular weight, measured by gel permeation chromatography using universal calibration and polystyrene standards, of the poly(vinylphenol) resin is preferably from 1.000 to 200,000 g/mol, more preferably from 1,500 to 50,000 g/mol.

Examples of phenolic resins are:

PR-01: ALNOVOL SPN452 is a solution of a novolac resin, 40% by weight in Dowanol PM, obtained from CLARIANT GmbH.

Dowanol PM consists of 1-methoxy-2-propanol (>99.5%) and 2-methoxy-1-propanol (<0.5%).

PR-02: ALNOVOL SPN400 is a solution of a novolac resin, 44% by weight in Dowanol PMA, obtained from CLARIANT GmbH.

Dowanol PMA consists of 2-methoxy-1-methyl-ethylacetate.

PR-03: ALNOVOL HPN100 a novolac resin obtained from CLARIANT GmbH.

PR-04: DURITE PD443 is a novolac resin obtained from BORDEN CHEM. INC.

PR-05: DURITE SD423A is a novolac resin obtained from BORDEN CHEM. INC.

PR-06: DURITE SD126A is a novolac resin obtained from BORDEN CHEM. INC.

PR-07: BAKELITE 6866LB02 is a novolac resin obtained from BAKELITE AG.

PR-08: BAKELITE 6866LB03 is a novolac resin obtained from BAKELITE AG.

PR-09: KR 400/8 is a novolac resin obtained from KOYO CHEMICALS INC.

PR-10: HRJ 1085 is a novolac resin obtained from SCHNECTADY INTERNATIONAL INC.

PR-11: HRJ 2606 is a phenol novolac resin obtained from SCHNECTADY INTERNATIONAL INC.

PR-12: LYNCUR CMM is a copolymer of 4-hydroxy-styrene and methyl methacrylate obtained from SIBER HEGNER.

PR-13: synthesis of a vinylcopolymer as described WO04/035310 in the examples (preparation of polymer MP-30).

In a preferred positive-working lithographic printing plate precursor, the coating also contains one or more dissolution inhibitors. Dissolution inhibitors are compounds which reduce the dissolution rate of the hydrophobic polymer in the aqueous alkaline developer at the non-exposed areas of the coating and wherein this reduction of the dissolution rate is destroyed by the heat generated during the exposure so that the coating readily dissolves in the developer at exposed areas. The dissolution inhibitor exhibits a substantial latitude in dissolution rate between the exposed and non-exposed areas. By preference, the dissolution inhibitor has a good dissolution rate latitude when the exposed coating areas have dissolved completely in the developer before the non-exposed areas are attacked by the developer to such an extent that the ink-accepting capability of the coating is affected. The dissolution inhibitor(s) can be added to the layer which comprises the hydrophobic polymer discussed above.

The dissolution rate of the non-exposed coating in the developer is preferably reduced by interaction between the hydrophobic polymer and the inhibitor, due to e.g. hydrogen bonding between these compounds. Suitable dissolution inhibitors are preferably organic compounds which comprise at least one aromatic group and a hydrogen bonding site, e.g. a carbonyl group, a sulfonyl group, or a nitrogen atom which may be quaternized and which may be part of a heterocyclic ring or which may be part of an amino substituent of said organic compound. Suitable dissolution inhibitors of this type have been disclosed in e.g. EP-A 825 927 and 823 327.

Water-repellent polymers represent an another type of suitable dissolution inhibitors. Such polymers seem to increase the developer resistance of the coating by repelling the aqueous developer from the coating. The water-repellent polymers can be added to the layer comprising the hydrophobic polymer and/or can be present in a separate layer provided on top of the layer with the hydrophobic polymer. In the latter embodiment, the water-repellent polymer forms a barrier layer which shields the coating from the developer and the solubility of the barrier layer in the developer or the penetrability of the barrier layer by the developer can be increased by exposure to heat or infrared light, as described in e.g. EP-A 864420, EP-A 950 517 and WO99/21725. Preferred examples of the water-repellent polymers are polymers comprising siloxane and/or perfluoroalkyl units. In one embodiment, the coating contains such a water-repellent polymer in an amount between 0.5 and 25 mg/m$^2$, preferably between 0.5 and 15 mg/m and most preferably between 0.5 and 10 mg/m$^2$. When the water-repellent polymer is also ink-repelling, e.g. in the case of polysiloxanes, higher amounts than 25 mg/m$^2$ can result in poor ink-acceptance of the non-exposed areas. An amount lower than 0.5 mg/m$^2$ on the other hand may lead to an unsatisfactory development resistance. The polysiloxane may be a linear, cyclic or complex cross-linked polymer or copolymer. The term polysiloxane compound shall include any compound which contains more than one siloxane group —Si(R,R')—O—, wherein R and R' are optionally substituted alkyl or aryl groups. Preferred siloxanes are phenylalkylsiloxanes and dialkylsiloxanes. The number of siloxane groups in the (co)polymer is at least 2, preferably at least 10, more preferably at least 20. It may be less than 100, preferably less than 60. In another embodiment, the water-repellent polymer is a block-copolymer or a graft-copolymer of a poly (alkylene oxide) block and a block of a polymer comprising siloxane and/or perfluoroalkyl units. A suitable copolymer comprises about 15 to 25 siloxane units and 50 to 70 alkylene oxide groups. Preferred examples include copolymers comprising phenylmethylsiloxane and/or dimethylsiloxane as well as ethylene oxide and/or propylene oxide, such as Tego Glide 410, Tego Wet 265, Tego Protect 5001 or Silikophen P50/X, all commercially available from Tego Chemie, Essen, Germany. Such a copolymer acts as a surfactant which upon coating, due to its bifunctional structure, automatically positions itself at the interface between the coating and air and thereby forms a separate top layer even when the whole coating is applied from a single coating solution. Simultaneously, such surfactants act as a spreading agent which improves the coating quality. Alternatively, the water-repellent polymer can be applied in a second solution, coated on top of the layer comprising the hydrophobic polymer. In that embodiment, it may be advantageous to use a solvent in the second coating solution that is not capable of dissolving the ingredients present in the first layer so that a highly concentrated water-repellent phase is obtained at the top of the coating.

Preferably, also one or more development accelerators are included in the coating, i.e. compounds which act as dissolution promoters because they are capable of increasing the dissolution rate of the non-exposed coating in the developer. The simultaneous application of dissolution inhibitors and accelerators allows a precise fine tuning of the dissolution behavior of the coating. Suitable dissolution accelerators are cyclic acid anhydrides, phenols or organic acids. Examples of the cyclic acid anhydride include phthalic anhydride, tetrahydrophthalic anhydride, hexahydrophthalic anhydride, tetrachlorophthalic anhydride, maleic anhydride, chloromaleic anhydride, alpha-phenylmaleic anhydride, succinic anhydride, and pyromellitic anhydride, as described in U.S. Pat. No. 4,115,128. Examples of the phenols include bisphenol A, p-nitrophenol, p-ethoxyphenol, 2,4,4'-trihydroxybenzophenone, 2,3,4-trihydroxy-benzophenone, 4-hydroxybenzophenone, 4,4',4"-trihydroxy-triphenylmethane, and 4,4',3",4"-tetrahydroxy-3,5,3',5'-tetramethyltriphenyl-methane, and the like. Examples of the organic acids include sulfonic acids, sulfinic acids, alkylsulfuric acids, phosphonic acids, phosphates, and carboxylic acids, as described in, for example, JP-A Nos. 60-88,942 and 2-96,755. Specific examples of these organic acids include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid. The amount of the cyclic acid anhydride, phenol, or organic acid contained in the coating is preferably in the range of 0.05 to 20% by weight, relative to the coating as a whole.

The support has a hydrophilic surface or is provided with a hydrophilic layer. The support may be a sheet-like material such as a plate or it may be a cylindrical element such as a sleeve which can be slid around a print cylinder of a printing press. Preferably, the support is a metal support such as aluminum or stainless steel.

A particularly preferred lithographic support is an electrochemically grained and anodized aluminum support.

Graining and anodizing of aluminum lithographic supports is well known. The grained aluminum support used in the material of the present invention is preferably an electrochemically grained support. The acid used for graining can be e.g. nitric acid. The acid used for graining preferably comprises hydrogen chloride. Also mixtures of e.g. hydrogen chloride and acetic acid can be used.

The grained and anodized aluminum support may be post-treated to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with an organic acid and/or salt thereof, e.g. carboxylic acids, hydroxycarboxylic acids, sulfonic acids or phosphonic acids, or their salts, e.g. succinates, phosphates, phosphonates, sulfates, and sulfonates. A citric acid or citrate solution is preferred. This treatment may be carried out at room temperature or may be carried out at a slightly elevated temperature of about 30 to 50° C. A further post-treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde. It is further evident that one or more of these post-treatments may be carried out alone or in combination. More detailed descriptions of these treatments are given in GB-A-1 084 070, DE-A-4 423 140, DE-A-4 417 907, EP-A-659 909, EP-A-537 633, DE-A-4 001 466, EP-A-292 801, EP-A-291 760 and U.S. Pat. No. 4,458,005.

According to another embodiment, the support can also be a flexible support, which is provided with a hydrophilic layer, hereinafter called 'base layer'. The flexible support is e.g. paper, plastic film, thin aluminum or a laminate thereof. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 μm and is preferably 1 to 10 μm.

The hydrophilic binder for use in the base layer is e.g. a hydrophilic (co)polymer such as homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60% by weight, preferably 80% by weight.

The amount of hardening agent, in particular tetraalkyl orthosilicate, is preferably at least 0.2 parts per part by weight of hydrophilic binder, more preferably between 0.5 and 5 parts by weight, most preferably between 1 parts and 3 parts by weight.

The hydrophilic base layer may also contain substances that increase the mechanical strength and the porosity of the layer. For this purpose colloidal silica may be used. The colloidal silica employed may be in the form of any commercially available water dispersion of colloidal silica for example having an average particle size up to 40 nm, e.g. 20 nm. In addition inert particles of larger size than the colloidal silica may be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the hydrophilic base layer is given a uniform rough texture consisting of microscopic hills and valleys, which serve as storage places for water in background areas.

Particular examples of suitable hydrophilic base layers for use in accordance with the present invention are disclosed in EP-A-601 240, GB-P-1 419 512, FR-P-2 300 354, U.S. Pat. No. 3,971,660, and U.S. Pat. No. 4,284,705.

It is particularly preferred to use a film support to which an adhesion improving layer, also called support layer, has been provided. Particularly suitable adhesion improving layers for use in accordance with the present invention comprise a hydrophilic binder and colloidal silica as disclosed in EP-A-619 524, EP-A-620 502 and EP-A-619 525. Preferably, the amount of silica in the adhesion improving layer is between 200 mg/$m^2$ and 750 mg/$m^2$. Further, the ratio of silica to hydrophilic binder is preferably more than 1 and the surface area of the colloidal silica is preferably at least 300 $m^2$/gram, more preferably at least 500 $m^2$/gram.

The coating provided on the support is heat-sensitive and can preferably be handled in normal working lighting conditions (daylight, fluorescent light) for several hours. The coating preferably does not contain UV-sensitive compounds which have an absorption maximum in the wavelength range of 200 nm to 400 nm such as diazo compounds, photoacids, photoinitiators, quinone diazides, or sensitizers. Preferably the coating neither contains compounds which have an absorption maximum in the blue and green visible light wavelength range between 400 and 600 nm.

According to a preferred embodiment, the material of the present invention is image-wise exposed to infrared light, which is converted into heat by an infrared light absorbing agent, which may be a dye or pigment having an absorption maximum in the infrared wavelength range. The concentration of the sensitizing dye or pigment in the coating is typically between 0.25 and 10.0 wt. %, more preferably between 0.5 and 7.5 wt. % relative to the coating as a whole. Preferred IR-absorbing compounds are dyes such as cyanine or merocyanine dyes or pigments such as carbon black. A suitable compound is the following infrared dye:

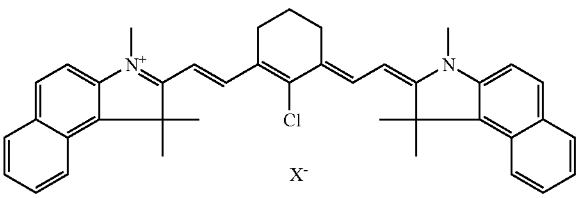

wherein $X^-$ is a suitable counter ion such as tosylate.

The coating may further contain an organic dye which absorbs visible light so that a perceptible image is obtained upon image-wise exposure and subsequent development. Such a dye is often called contrast dye or indicator dye. Preferably, the dye has a blue color and an absorption maximum in the wavelength range between 600 nm and 750 nm. Although the dye absorbs visible light, it preferably does not sensitize the printing plate precursor, i.e. the coating does not become more soluble in the developer upon exposure to visible light. Suitable examples of such a contrast dye are the quaternized triarylmethane dyes. Another suitable compound is the following dye:

CD-1

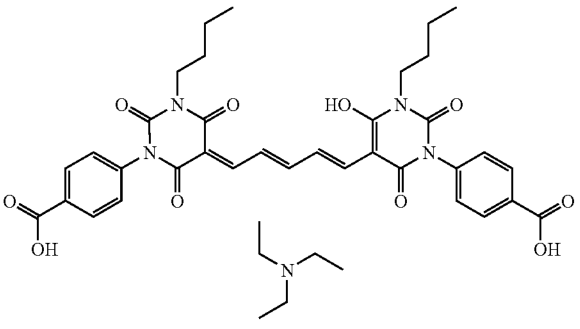

The infrared light absorbing compound and the contrast dye may be present in the layer comprising the hydrophobic polymer, and/or in the barrier layer discussed above and/or in an optional other layer. According to a highly preferred embodiment, the infrared light absorbing compound is concentrated in or near the barrier layer, e.g. in an intermediate layer between the layer comprising the hydrophobic polymer and the barrier layer.

The printing plate precursor of the present invention can be exposed to infrared light with LEDs or a laser. Preferably, a laser emitting near infrared light having a wavelength in the range from about 750 to about 1500 nm is used, such as a semiconductor laser diode, a Nd:YAG or a Nd:YLF laser. The required laser power depends on the sensitivity of the image-recording layer, the pixel dwell time of the laser beam, which is determined by the spot diameter (typical value of modern plate-setters at 1/$e^2$ of maximum intensity: 10-25 μm), the scan speed and the resolution of the exposure apparatus (i.e. the number of addressable pixels per unit of linear distance, often expressed in dots per inch or dpi; typical value: 1000-4000 dpi).

Two types of laser-exposure apparatuses are commonly used: internal (ITD) and external drum (XTD) plate-setters. ITD plate-setters for thermal plates are typically characterized by a very high scan speed up to 1500 m/sec and may require a laser power of several Watts. The Agfa Galileo T is a typical example of a plate-setter using the ITD-technology. XTD plate-setters operate at a lower scan speed typically from 0.1 m/sec to 10 m/sec and have a typical laser-output-power per beam from 20 mW up to 500 mW. The Creo Trendsetter plate-setter family and the Agfa Excalibur plate-setter family both make use of the XTD-technology.

The known plate-setters can be used as an off-press exposure apparatus, which offers the benefit of reduced press down-time. XTD plate-setter configurations can also be used for on-press exposure, offering the benefit of immediate registration in a multi-color press. More technical details of on-press exposure apparatuses are described in e.g. U.S. Pat. No. 5,174,205 and U.S. Pat. No. 5,163,368.

In the development step, the non-image areas of the coating can be removed by immersion in an aqueous alkaline developer, which may be combined with mechanical rubbing, e.g. by a rotating brush. The developer preferably has a pH above 10, more preferably above 12. The development step may be followed by a rinsing step, a gumming step, a drying step and/or a post-baking step.

The printing plate thus obtained can be used for conventional, so-called wet offset printing, in which ink and an aqueous dampening liquid is supplied to the plate. Another suitable printing method uses so-called single-fluid ink without a dampening liquid. Single-fluid ink consists of an ink phase, also called the hydrophobic or oleophilic phase, and a polar phase which replaces the aqueous dampening liquid that is used in conventional wet offset printing. Suitable examples of single-fluid inks have been described in U.S. Pat. No. 4,045,232; U.S. Pat. No. 4,981,517 and U.S. Pat. No. 6,140,392. In a most preferred embodiment, the single-fluid ink comprises an ink phase and a polyol phase as described in WO 00/32705.

Examples

Preparation of the Lithographic Substrate

A 0.30 mm thick aluminum foil was degreased by immersing the foil in an aqueous solution containing 40 g/l of sodium hydroxide at 60° C. for 8 seconds and rinsed with demineralized water for 2 seconds. The foil was then electrochemically grained during 15 seconds using an alternating current in an aqueous solution containing 12 g/l of hydrochloric acid and 38 g/l of aluminum sulfate (18-hydrate) at a temperature of 33° C. and a current density of 130 $A/dm^2$. After rinsing with demineralized water for 2 seconds, the aluminum foil was then desmutted by etching with an aqueous solution containing 155 g/l of sulfuric acid at 70° C. for 4 seconds and rinsed with demineralized water at 25° C. for 2 seconds. The foil was subsequently subjected to anodic oxidation during 13 seconds in an aqueous solution containing 155 g/l of sulfuric acid at a temperature of 45° C. and a current density of 22 $A/dm^2$, then washed with demineralized water for 2 seconds and post-treated for 10 seconds with a solution containing 4 g/l of polyvinylphosphonic acid at 40° C., rinsed with demineralized water at 20° C. during 2 seconds and dried.

The support thus obtained was characterized by a surface roughness Ra of 0.50 μm and an anodic weight of 2.9 g/m of $Al_2O_3$.

Monomer-01 has the following structure:

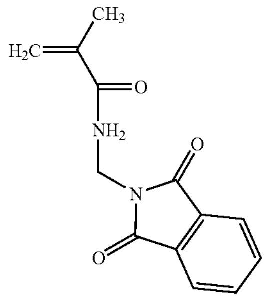

Monomer-02 has the following structure:

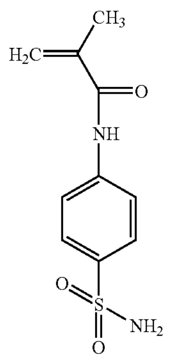

Monomer-03 has the following structure:

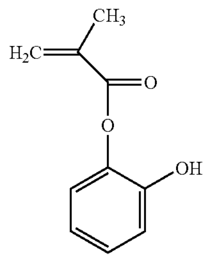

Synthesis of Polymer-01:

Polymer-01 is a copolymer of N-vinylcaprolactam, Monomer-01 and acrylic acid in a molar ratio of 23/57/20. Polymer-01 is prepared by the following method:

6.90 g (0.050 mol) of N-vinylcaprolactam, 30.0 g (0.123 mol) of Monomer-01 and 3.11 g (0.043 mol) of acrylic acid were added to a closed reaction vessel fitted with a water-cooled condenser, thermometer, nitrogen inlet and mechanical stirrer, containing 129.6 g of γ-butyrolactone. The obtained mixture was stirred under heating at 90° C. till it became a clear solution.

1.52 g of azo-initator dimethyl-2,2'-azobisisobutyrate (V601 supplied by Wako Pure Chemical Industries, Ltd) was dissolved in 28.9 g of γ-butyrolactone. The obtained solution was added dropwise to the reaction mixture for 30 minutes. After this the reaction was continued at 90° C. for additional 7 hours. After completion of the reaction, the temperature was adjusted to room-temperature. The resulting polymer solution has a concentration of approximately 20%.

Synthesis of Polymer-02:

Polymer-02 is a copolymer of N-vinylcaprolactam, Monomer-01 and methacrylic acid in a molar ratio of 23/57/20. Polymer-02 is prepared by the following method:

6.80 g (0.0488 mol) of N-vinylcaprolactam, 29.55 g (0.121 mol) of Monomer-01 and 3.65 g (0.0424 mol) of methacrylic acid were added to a closed reaction vessel fitted with a water-cooled condenser, thermometer, nitrogen inlet and mechanical stirrer, containing 129.6 g of γ-butyrolactone. The obtained mixture was stirred under heating at 90° C. till it became a clear solution.

1.52 g of azo-initator dimethyl-2,2'-azobisisobutyrate (V601 supplied by Wako Pure Chemical Industries, Ltd) was dissolved in 28.9 g of γ-butyrolactone. The obtained solution was added dropwise to the reaction mixture for 30 minutes.

After this the reaction was continued at 90° C. for additional 7 hours. After completion of the reaction, the temperature was adjusted to room-temperature. The resulting polymer solution has a concentration of approximately 20%.

Synthesis of Polymer-03:

Polymer-03 is a copolymer of N-vinylcaprolactam, Monomer-01 and methacrylic acid in a molar ratio of 11/69/20. Polymer-03 is prepared by the following method:

3.05 g (0.0219 mol) of N-vinylcaprolactam, 33.57 g (0.137 mol) of Monomer-01 and 3.43 g (0.0398 mol) of methacrylic acid were added to a closed reaction vessel fitted with a water-cooled condenser, thermometer, nitrogen inlet and mechanical stirrer, containing 129.6 g of γ-butyrolactone. The obtained mixture was stirred under heating at 90° C. till it became a clear solution.

1.52 g of azo-initator dimethyl-2,2'-azobisisobutyrate (V601 supplied by Wako Pure Chemical Industries, Ltd) was dissolved in 28.9 g of γ-butyrolactone. The obtained solution was added dropwise to the reaction mixture for 30 minutes. After this the reaction was continued at 90° C. for additional 7 hours. After completion of the reaction, the temperature was adjusted to room-temperature. The resulting polymer solution has a concentration of approximately 20%.

Synthesis of Polymer-04:

Polymer-04 is a copolymer of N-vinylcaprolactam, Monomer-02 and methyl methacrylate in a molar ratio of 34/36/30. Polymer-04 is prepared by the following method:

6.50 g (0.0467 mol) of N-vinylcaprolactam, 11.88 g (0.0494 mol) of Monomer-02, 4.12 g (0.0412 mol) of methyl methacrylate and 44.39 g of N,N-dimethylacetamide were added into a 250 ml three-necked flask provided with a stirrer, a condenser, nitrogen inlet, thermometer and dropping funnel. The obtained mixture was stirred under heating at 65° C. till it became a clear solution.

0.41 g of azo-initiator 2,2'-azobis(2-methylbutyronitrile) (V59 supplied by Wako Pure Chemical Industries, Ltd) was dissolved in 7.7 g of N,N-dimethylacetamide. The obtained solution was added dropwise to the reaction mixture for 15 minutes. After completion of the addition, the reaction was further stirred at 65° C. for additional 2 hours.

A mixture of 6.50 g (0.0467 mol) of N-vinylcaprolactam, 11.88 g (0.0494 mol) of Monomer-02, 4.12 g (0.0412 mol) of methyl methacrylate, 52.09 g of N,N-dimethylacetamide and 0.41 g of azo-initiator 2,2'-azobis(2-methylbutyronitrile) (V59 supplied by Wako Pure Chemical Industries, Ltd) was added dropwise to the reaction mixture through a dropping funnel for 2 hours. After completion of the addition, the reaction was stirred at 65° C. for additional 2 hours.

104.2 g of methanol was added and the temperature was adjusted to room-temperature. The obtained mixture was added to 2 liters of water while the water was stirred. After stirring the mixture for 30 minutes, precipitates thus formed were taken by the filtration and dried at 40° C. under vacuum. The obtained polymer was dissolved in γ-butyrolactone and the resulting polymer solution has a concentration of approximately 30%.

Synthesis of Polymer-05:

Polymer-05 is a copolymer of Monomer-01 and Monomer-03 in a molar ratio of 57/43. Polymer-05 is prepared by the following method:

23.33 g (0.096 mol) of Monomer-01 and 12.84 g (0.072 mol) of Monomer-03 were added to a closed reaction vessel fitted with a water-cooled condenser, thermometer, nitrogen inlet and mechanical stirrer, containing 162 g of γ-butyrolactone. The obtained mixture was stirred under heating at 90° C. till it became a clear solution. 1.9 g of azo-initiator dimethyl-2,2'-azobisisobutyrate (V601 supplied by Wako Pure Chemical Industries, Ltd) was dissolved in 36.1 g of γ-butyrolactone. The obtained solution was added dropwise to the reaction mixture for 30 minutes. After this the reaction was continued at 90° C. for additional 7 hours. After completion of the reaction, the temperature was adjusted to room-temperature. The resulting polymer solution has a concentration of approximately 20%.

Preparation of the printing plate precursors PPP-01 to PPP-05:

The printing plate precursors PPP-01 to PPP-05 were produced by applying a first coating defined in Table 1 onto the above described lithographic support. The solvent used to apply the coating is a mixture of 50% methylethyl ketone (MEK)/50% Dowanol PM (1-methoxy-2-propanol from Dow Chemical Company). The coating was applied at a wet coating thickness of 20 μm and then dried at 135° C.

TABLE 1

| INGREDIENTS | Composition of the coating ($g/m^2$) PPP-01 ($g/m^2$) | PPP-02 ($g/m^2$) | PPP-03 ($g/m^2$) | PPP-04 ($g/m^2$) | PPP-05 ($g/m^2$) |
|---|---|---|---|---|---|
| Basonyl blue 640 (1) | 0.0233 | 0.0233 | 0.0233 | 0.0195 | 0.0233 |
| Polymer-01 | 1.162 | | | | |
| Polymer-02 | | 1.162 | | | |
| Polymer-03 | | | 1.162 | | |
| Polymer-04 | | | | 0.975 | |
| Polymer-05 | | | | | 1.162 |
| SOO94 IR-1 (2) | 0.0255 | | | | 0.0255 |
| Tegoglide 410 (3) | 0.00242 | 0.00242 | 0.00242 | | 0.00242 |
| Dry thickness ($g/m^2$) | 1.21 | 1.19 | 1.19 | 0.98 | 1.21 |

(1) Basonyl blue 640 is a quaternised triaryl methane dye, commercially available from BASF (2) SOO94 is an IR absorbing cyanine dye, commercially available from FEW CHEMICALS; the chemical structure of SOO94 is equal to IR-1

IR-1

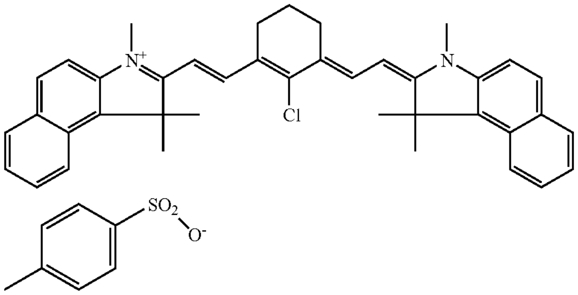

(3) Tegoglide 410 is a copolymer of polysiloxane and polyalkylene oxide, commercially available from Tego Chemie Service GmbH Onto the dried first coating, a second coating defined in Table 2 was coated at a wet thickness of 16 μm and dried at 135° C. The solvent used to apply the coating is a mixture of 50% isopropanol/50% Dowanol PM (1-methoxy-2-propanol from Dow Chemical Company). The dry coating weight was 0.76 $g/m^2$.

TABLE 2

| Composition of the coating (g/m²) | |
|---|---|
| INGREDIENTS | Second coating (g/m²) |
| Alnovol SP452 (1) | 0.6250 |
| 3,4,5-trimethoxy cinnamic acid | 0.0808 |
| SOO94 IR-1 (2) | 0.0320 |
| Basonyl blue 640 (3) | 0.0080 |
| Tegoglide 410 (4) | 0.0032 |
| Tegowet 265 (5) | 0.0013 |
| Dry thickness (g/m²) | 0.76 |

(1) Alnovol SPN452 is a 40.5 weight % solution of novolac in Dowanol PM, commercially available from Clariant
(2) SOO94 is an IR absorbing cyanine dye, commercially available from FEW CHEMICALS; the chemical structure of SOO94 is equal to IR-1 (see Table 1)
(3) Basonyl blue 640 is a quaternised triaryl methane dye, commercially available from BASF
(4) Tegoglide 410 is a copolymer of polysiloxane and polyalkylene oxide, commercially available from Tego Chemie Service GmbH
(5) Tegowet 265 is a copolymer of polysiloxane and polyalkylene oxide, commercially available from Tego Chemie Service GmbH Preparation of the Printing Plate Precursors PPP-06:

The printing plate precursor PPP-06 was produced by applying the coating defined in Table 3 onto the above described lithographic support. The solvent used to apply the coating is a mixture of 50% methylethyl ketone (MEK)/50% Dowanol PM (1-methoxy-2-propanol from Dow Chemical Company). The coating was applied at a wet coating thickness of 20 μm and then dried at 135° C. The dry coating weight was 1.16 g/m².

TABLE 3

| Composition of the coating (g/m²) | |
|---|---|
| INGREDIENTS | PPP-06 (g/m²) |
| Alnovol SP452 (1) | 0.970 |
| 3,4,5-trimethoxy cinnamic acid | 0.124 |
| SOO94 IR-1 (2) | 0.0500 |
| Basonyl blue 640 (3) | 0.0125 |
| Tegoglide 410 (4) | 0.0050 |
| Tegowet 265 (5) | 0.0020 |
| Dry thickness (g/m²) | 1.16 |

(1) to (5): see Table 1 and Table 2

Chemical Resistance

For measuring the chemical resistance 3 different solutions were selected:

Test solution 1: solution of isopropanol in a concentration of 50% by weight in water, Test solution 2: EMERALD PREMIUM MXEH, commercially available from ANCHOR, Test solution 3: ANCHOR AQUA AYDE, commercially available from ANCHOR.

The chemical resistance was tested by contacting a droplet of 40 μl of a test solution on different spots of the coating. After 3 minutes, the droplet was removed from the coating with a cotton pad. The attack on the coating due to each test solution was rated by visual inspection as follows:

0: no attack,

1: changed gloss of the coating's surface,

2: small attack of the coating (thickness is decreased),

3: heavy attack of the coating,

4: completely dissolved coating.

The higher the rating, the less is the chemical resistance of the coating. The results for the test solutions on each printing plate precursor are summarized in Table 4.

TABLE 4

| Test results for the chemical resistance | | | | |
|---|---|---|---|---|
| EXAMPLE number | Type PPP | Test solution 1 | Test solution 2 | Test solution 3 |
| Invention Example 1 | PPP-01 | 1 | 1 | 1 |
| Invention Example 2 | PPP-02 | 1 | 1 | 1 |
| Invention Example 3 | PPP-03 | 1 | 1 | 1 |
| Invention Example 4 | PPP-04 | 1 | 1 | 1 |
| Comparative Example 1 | PPP-05 | 0 | 1 | 0 |
| Comparative Example 2 | PPP-06 | 3 | 4 | 3 |

The test results of Table 4 demonstrate that the precursors PPP-01 to PPP-04 show an improved chemical resistance compared with novolac in PPP-06. The chemical resistance of precursor PPP-05 is also improved but the differentiation between the exposed and non-exposed areas is insufficient as indicated below.

Image-Wise Exposure and Developing

The printing plate precursors were exposed with a Creo Trendsetter 3244 (plate-setter, trademark from Creo, Burnaby, Canada), operating at 150 rpm and varying energy densities up to 200 mJ/cm². The imagewise exposed plate percursors were processed by dipping them in a tank in steps of 10 seconds with a maximum of 120 seconds at 25° C., and using the Agfa TD6000A developer, commercially available by Agfa-Gevaert. The optical density was measured at the non-exposed areas (corresponding to Dmax in the figures) and at the exposed areas (corresponding to Dmin in the figures). The optical density measurements were carried out by using a GretagMacbeth D19C densitometer, commercially available from Gretag-Macbeth AG, equipped with the filter that corresponds to the color of the coating (in these experiments, the cyan filter was used). The optical density values were measured with reference to the uncoated support of the plate and are an indication of the amount of the coating remaining on the support. The optical density of the exposed and non-exposed areas are plotted versus developing time in FIG. 1 to FIG. 5.

Figure 5:
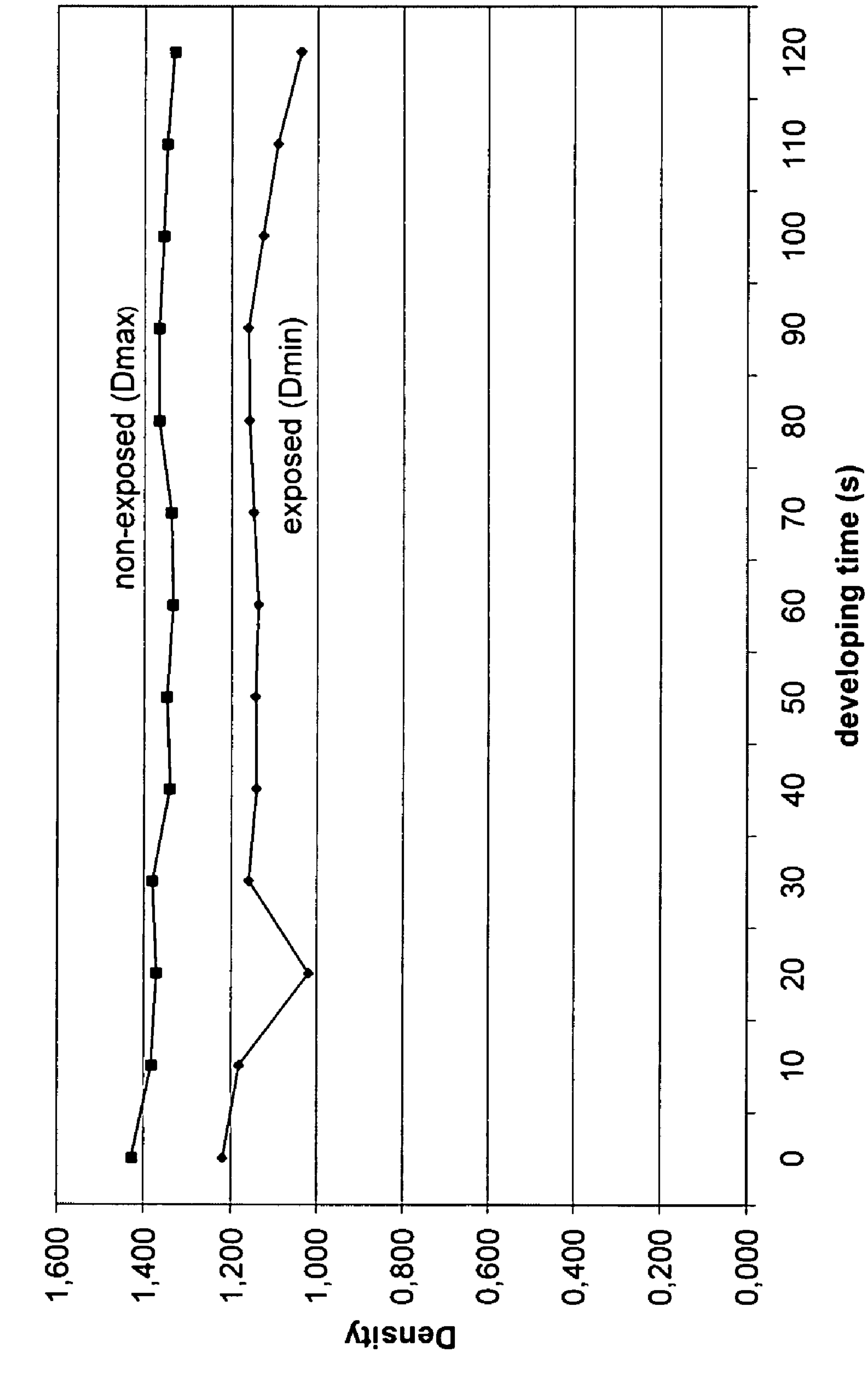
FIG. 5 shows the dissolution kinetics between the exposed and non-exposed areas of the coating for PPP-05, i.e. the optical density of irradiated (Dmin) and non-irradiated (Dmax) parts versus developing time (in seconds).

The printing plates, obtained from PPP-01 to PPP-04, exhibit a good differentiation between the exposed and non-exposed areas whereby the exposed areas are removed by the developer (i.e. Dmin in the FIGS. 1 to 4) while the non-exposed areas are substantially not affected by the developer solution (i.e. Dmax in the FIGS. 1 to 4) (positive-working printing plates). This is illustrated in the figures by the difference in dissolution kinetics between the exposed and non-exposed areas of the plates. In the exposed areas of PPP-05, only a small part of the coating has been removed by the developer (this is indicated by the high value for the optical density in the exposed areas (Dmin)), resulting in an insufficient differentiation between the exposed and non-exposed areas. This is illustrated in FIG. 5.

The invention claimed is:

1. A positive-working heat-sensitive lithographic printing plate precursor comprising a support having a hydrophilic surface or which is provided with a hydrophilic layer, a coating which does not dissolve in an aqueous alkaline developer in the unexposed areas and which becomes soluble in an aqueous alkaline developer in the exposed areas, and an intermediate layer between said hydrophilic surface or said hydrophilic layer and said coating, wherein said intermediate layer comprises a first polymer having a first monomeric unit which is vinylcaprolactam, wherein said first polymer comprises said first monomeric unit in an amount between 3 mol % and 75 mol %, wherein said first polymer further comprises a second monomeric unit of formula II:

(formula II)

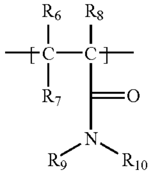

wherein $R_6$, $R_7$ and $R_8$ are independently a hydrogen atom or an optionally substituted alkyl group, $R_9$ is a hydrogen atom, or an optionally substituted alkyl, cycloalkyl, aryl or arylalkyl group, $R_{10}$ is represented by formula IV:

(formula IV)

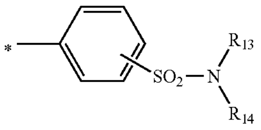

wherein

* denotes the position of attachment of the group $R_{10}$ to the nitrogen atom in formula II, $R_{13}$ and $R_{14}$ are independently a hydrogen atom, or an optionally substituted alkyl, alkenyl, cycloalkyl, aryl, arylalkyl or heteroaryl group, or wherein $R_{13}$ and $R_{14}$ together form a cyclic structure.

2. A precursor according to claim 1, wherein said first polymer further comprises a third monomeric unit of formula VI:

(formula VI)

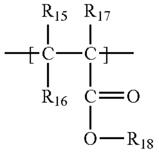

wherein $R_{15}$, $R_{16}$ and $R_{17}$ are independently a hydrogen atom or an optionally substituted alkyl group, $R_{18}$ is a hydrogen atom, a positive charged metal ion or ammonium ion, or an optionally substituted alkyl, cycloalkyl, aryl or arylalkyl group.

3. A precursor according to claim 2, wherein said first polymer comprises said third monomeric unit in an amount between 2 mol % and 70 mol %.

4. A method of making a positive-working heat-sensitive lithographic printing plate comprising the steps of (i) providing a positive-working lithographic printing plate precursor as defined in claim 1, (ii) image-wise exposing the precursor to IR-radiation or heat, and (iii) developing the image-wise exposed precursor with an aqueous alkaline developing solution thereby removing the coating on the exposed areas while essentially not affecting the coating in the non-exposed areas by the developer.

5. A precursor according to claim 1, wherein said first polymer comprises said second monomeric unit in an amount between 5 mol % and 95 mol %.

* * * * *